(12) United States Patent
Kobayashi

(10) Patent No.: US 7,626,214 B2
(45) Date of Patent: Dec. 1, 2009

(54) SMALL-SIZED SEMICONDUCTOR DEVICE FEATURING PROTECTION CIRCUIT FOR MOSFET

(75) Inventor: Hiroyoshi Kobayashi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 134 days.

(21) Appl. No.: 11/600,826

(22) Filed: Nov. 17, 2006

(65) Prior Publication Data

US 2007/0126038 A1 Jun. 7, 2007

(30) Foreign Application Priority Data

Nov. 17, 2005 (JP) .............................. 2005-332764

(51) Int. Cl.
*H01L 23/62* (2006.01)
(52) U.S. Cl. ..................... 257/124; 257/409; 257/605
(58) Field of Classification Search ................ 257/288, 257/409, 122, 124, 605
See application file for complete search history.

(56) References Cited

U.S. PATENT DOCUMENTS

| 5,736,779 | A  | * | 4/1998 | Kobayashi ................ 257/603 |
| 5,985,708 | A  | * | 11/1999 | Nakagawa et al. .......... 438/206 |
| 6,940,131 | B2 | * | 9/2005 | Baldwin et al. ............. 257/355 |
| 2002/0195657 | A1 | * | 12/2002 | Williams et al. ............ 257/332 |
| 2005/0156207 | A1 | * | 7/2005 | Yazawa et al. .............. 257/288 |

* cited by examiner

*Primary Examiner*—Lynne A> Gurley
*Assistant Examiner*—Vernon P Webb
(74) *Attorney, Agent, or Firm*—Young & Thompson

(57) ABSTRACT

In a semiconductor device, a metal oxide semiconductor field effect transistor (MOSFET) is formed in a semiconductor substrate, and an isolation layer is formed on the semiconductor substrate so as to extend along a side of the semiconductor substrate. A first conductive layer is formed on the isolation layer along the side of the semiconductor substrate so as to be electrically connected to a gate of the MOSFET. A second conductive layer is formed on the isolation layer along the side of the semiconductor substrate so as to be electrically connected to a drain of the MOSFET. A protection circuit is made of at least two diodes which are defined between the first conductive layer and the second conductive layer.

11 Claims, 9 Drawing Sheets

SMALL-SIZED SEMICONDUCTOR DEVICE FEATURING PROTECTION CIRCUIT FOR MOSFET

BACKGROUND OF THE INVENTION

1. Field of the Invention

The present invention relates to a semiconductor device including a metal oxide semiconductor field effect transistor (MOSFET), and a protection circuit for protecting the MOSFET from being subjected to a breakdown.

2. Description of the Related Art

In such a semiconductor device, a MOSFET may be used as a power ON/OFF switch to energize and de-energize a load circuit containing an inductor. Namely, when the MOSFET is turned ON, the load circuit is energized. When the MOSFET is turned OFF, the load circuit is de-energized. When the load circuit is de-energized, a counter electromotive force is generated by the inductor of the load circuit. At this time, a voltage is applied to the drain of the power MOSFET device due to the generation of the counter electromotive force. When the applied voltage is too large, the power MOSFET device may be subjected to a breakdown.

JP-H08-172190 A has proposed a semiconductor device in which a protection circuit made of a plurality of Zener diodes is connected to a power MOSFET so that the power MOSFET may be protected from the breakdown, as discussed in detail hereinafter.

SUMMARY OF THE INVENTION

It has now been discovered that the above-mentioned prior art semiconductor device has a problem to be solved as mentioned hereinbelow.

The above-mentioned semiconductor device fails in diminishing the size thereof, because it needs a relatively large semiconductor substrate for a formation of the Zener diodes of the protection circuit.

In accordance with an aspect of the present invention, there is provided a semiconductor device including a semiconductor substrate, a metal oxide semiconductor field effect transistor (MOSFET) formed in the semiconductor substrate, an isolation layer formed on the semiconductor substrate so as to extend along a side of the semiconductor substrate, a first conductive layer formed on the isolation layer along the side of the semiconductor substrate so as to be electrically connected to a gate of the MOSFET, a second conductive layer formed on the isolation layer along the side of the semiconductor substrate so as to be electrically connected to a drain of the MOSFET, and a protection circuit made of at least two diodes which are defined between the first conductive layer and the second conductive layer.

The first and second conductive layers may be formed as first and second first-conductivity type layers, respectively, and the at least two diodes are defined by forming a second-conductivity type semiconductor region between the first and second first-conductivity type layers.

The first and second first-conductivity type layers and the second-conductivity type semiconductor region may be derived from a first-conductivity type polycrystalline silicon layer formed on the isolation layer. In this case, the second-conductivity type semiconductor region is defined by implanting second-conductivity type impurities into the first-conductivity type polycrystalline silicon layer.

The isolation layer may be formed as a frame-like isolation layer along a periphery of the semiconductor substrate. Preferably, the first and second first-conductivity type layers are formed as first and second frame-like conductive layers which extend along the frame-like isolation layer. In this case, the second-conductivity type semiconductor region completely may extend between the first and second frame-like conductive layers. Otherwise, the second-conductivity type semiconductor region partially may extend between the first and second frame-like conductive layers.

Preferably, the first and second conductive layers are formed as first and second N-type polycrystalline silicon layers. In this case, the at least two diodes is defined by forming a P-type polycrystalline silicon region between first and second N-type polycrystalline silicon layers.

The first and second N-type polycrystalline silicon layers and the P-type polycrystalline silicon region may be derived from an N-type polycrystalline silicon layer formed on the isolation layer. In this case, the P-type polycrystalline silicon region is defined by implanting P-type impurities into the N-type polycrystalline silicon layer.

The semiconductor device may further include an insulating interlayer formed on the semiconductor layer so that the first and second conductive layers and the protection circuit are covered with the insulating interlayer. In this case, a gate metal interconnection layer may be formed on the insulating interlayer so as to be electrically connected to the first conductive layer through an opening which is formed in the insulating interlayer, and which is filled with a material of the gate metal interconnection layer. Optionally, the gate metal interconnection layer may be electrically connected to the first conductive layer through an opening which is formed in both the insulating interlayer the first conductive layer, and which is filled with a material of the gate metal interconnection layer. Also, a drain metal interconnection layer may be formed on the insulating interlayer so as to be electrically connected to the second conductive layer through an opening which is formed in the insulating interlayer, and which is filled with a material of the drain metal interconnection layer. Optionally, the drain metal interconnection layer may be electrically connected to the second conductive layer through an opening which is formed in both the insulating interlayer and second conductive layer, and which is filled with a material of the drain metal interconnection layer.

BRIEF DESCRIPTION OF THE DRAWINGS

The present invention will be more clearly understood from the description set forth below, as compared with the prior art semiconductor device, with reference to the accompanying drawings, wherein.

DESCRIPTION OF THE PREFERRED EMBODIMENT

Before description of embodiments of the present invention, for better understanding of the present invention, a prior art semiconductor device will be explained below with reference to FIGS. 1, 2 and 3.

Figure 1:
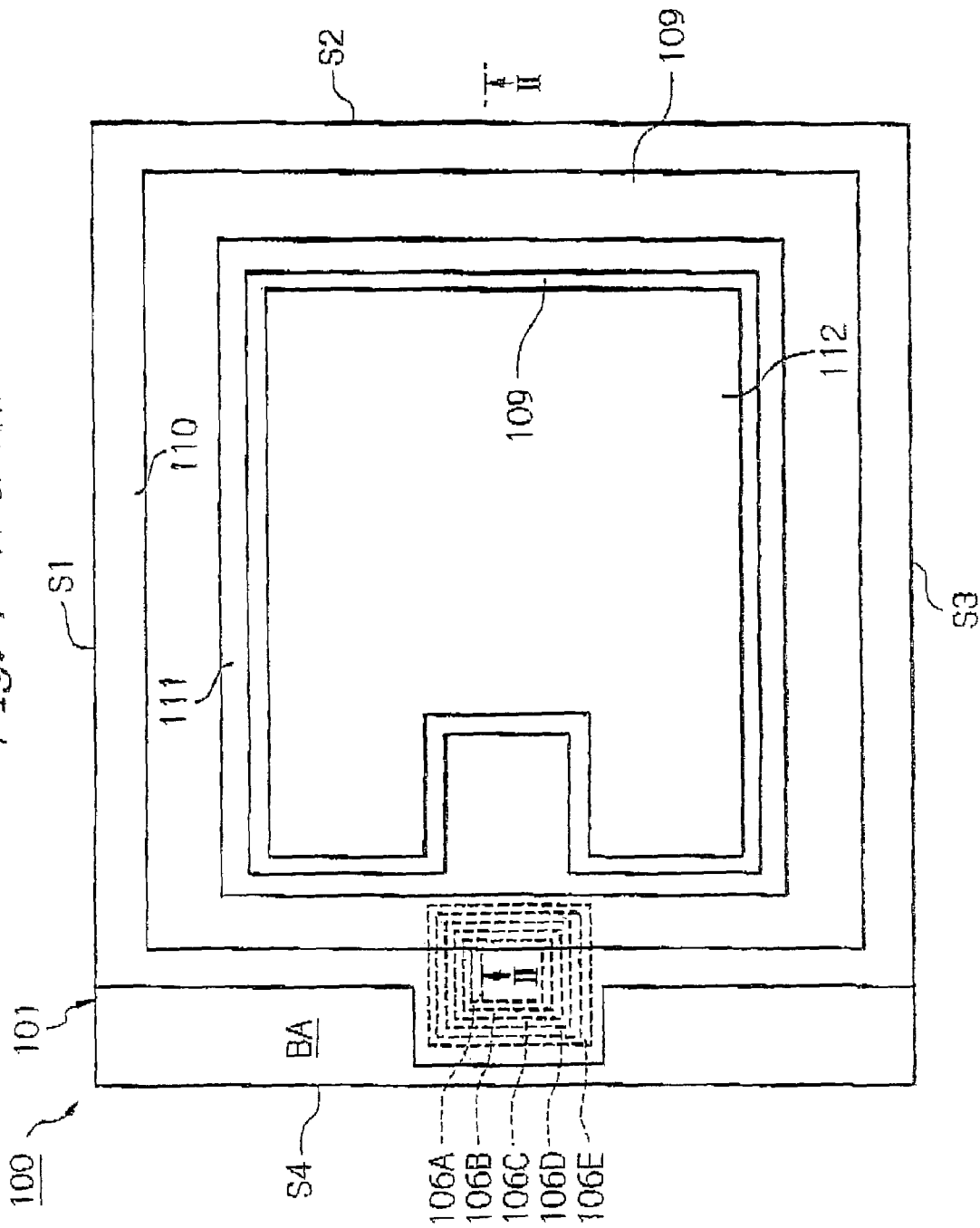
FIG. 1 is a plan view of a prior art semiconductor device including a MOSFET and a protection circuit therefor.
Figure 2:
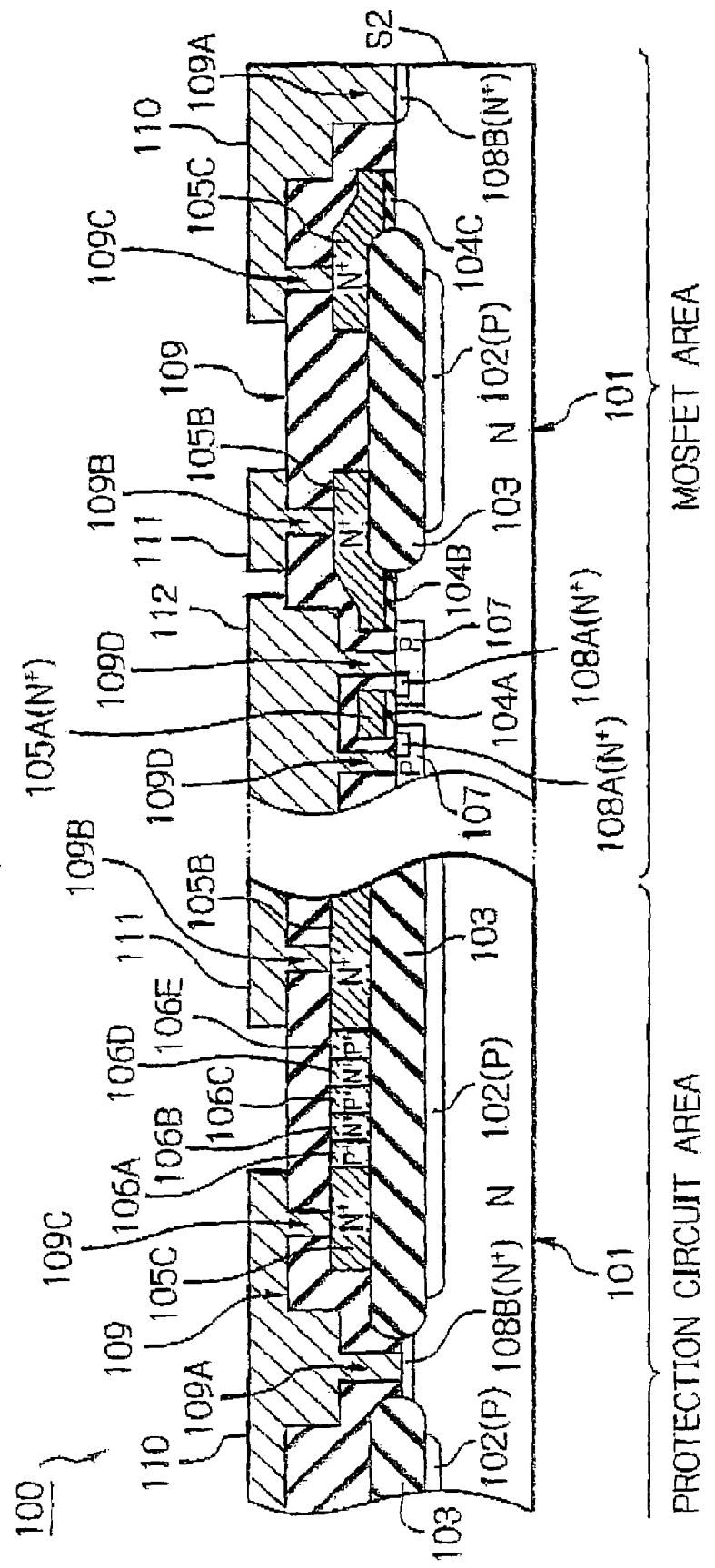
FIG. 2 is a cross-sectional view taken along the II-II line of FIG. 1.

FIGS. 1 and 2 show a prior art semiconductor device including a power MOSFET, and a protection circuit for protecting the power MOSFET from being subjected to a breakdown, as disclosed in JP-H08-172190 A. Note, FIG. 1 is a plan view of the semiconductor device, and FIG. 2 is a cross-sectional view taken along the II-II line of FIG. 1.

Referring to FIGS. 1 and 2, the semiconductor device is generally indicated by reference 100, and includes an N-type rectangular drain silicon substrate 101 having four sides S1, S2, S3 and S4.

As shown in FIG. 2, a protection circuit area and a MOSFET area are defined in the N-type drain silicon substrate 101. A P-type field region 102 is formed in the N-type drain silicon substrate 101 by using a P-type impurity-implanting process. The P-type field region 102 includes a large rectangular frame-like section formed in the MOSFET area, and a small rectangular frame-like section formed in the protection circuit area.

In particular, the large rectangular frame-like section formed in the MOSFET area has four side portions extending along the sides S1, S2, S3 and S4 of the N-type drain silicon substrate 101, so that a relatively large blank area BA is defined between the side S4 of the N-type drain silicon substrate 101 and the corresponding side portion of the P-type field region 102. Also, the small rectangular frame-like section formed in the protection circuit area is integrally extended from the large rectangular frame-like section into the relatively large blank area BA at the middle of the aforesaid corresponding side portion of the P-type field region 102.

As shown in FIG. 2, an element-isolation layer 103 is formed over the P-type field region 102 by using a localized oxidation of silicon (LOCOS) process. Thus, similar to the P-type field region 102, the element-isolation layer 103 includes a large rectangular frame-like section formed in the MOSFET area, and a small rectangular frame-like section formed in the protection circuit area. Note that a rectangular MOSFET-cell formation area is defined by the large rectangular frame-like section of the element-isolation layer 103.

A plurality of gate silicon dioxide layers 104A are formed on the MOSFET-cell formation area defined by the large rectangular frame-like section of the element-isolation layer 103. Note, in FIG. 2, only one of the gate silicon dioxide layers 104A is representatively illustrated. Also, when the gate silicon dioxide layers 104A are formed on the rectangular MOSFET-cell formation area, both an inner silicon dioxide layer 104B and an outer silicon dioxide layer 104C are simultaneously formed on the N-type drain silicon substrate 101 along the respective inner and outer sides of the large rectangular frame-like section of the element-isolation layer 103. The formation of the gate silicon dioxide layers 104A and the inner and outer silicon dioxide layers 104B and 104C may be carried out by using a thermal oxidization process.

A plurality of N$^+$-type gate polycrystalline silicon layers 105A are formed on the respective gate silicon dioxide layers 104A. Also, when the N$^+$-type gate polycrystalline silicon layers 105A are formed on the respective gate silicon dioxide layers 104A, both an N$^+$-type inner polycrystalline silicon layer 105B and an N$^+$-type outer polycrystalline silicon layer 105C are simultaneously formed on the large rectangular frame-like section of the element-isolation layer 103 along the respective inner and outer sides thereof, so that the inner and outer silicon dioxide layers 104B and 104C are covered with respective parts of the N$^+$-type inner polycrystalline silicon layers 105B and 105C. The formation of the N$^+$-type gate polycrystalline silicon layers 105A and both the inner and outer N$^+$-type polycrystalline silicon layers 105B and 105C may be carried out by using a chemical vapor deposition (CVD) process.

Although not illustrated in FIG. 2, the N$^+$-type inner polycrystalline silicon layer 105B is suitably and electrically connected to each of the N$^+$-type gate polycrystalline silicon layers 105A. Namely, the N$^+$-type inner polycrystalline silicon layer 105B serves as a gate polycrystalline silicon interconnect layer.

On the other hand, as stated hereinafter, the N$^+$-type inner polycrystalline silicon layer 105C is electrically connected to the N-type drain silicon substrate 101. Namely, the N$^+$-type inner polycrystalline silicon layer 105C serves as a drain polycrystalline silicon interconnect layer.

In the protection circuit area of FIG. 2, both the N$^+$-type inner polycrystalline silicon layers 105B and 105C are integrated with each other so as to extend over the small rectangular frame-like section of the element-isolation layer 103, and are connected to each other by six Zener diodes defined therebetween. Note, the six Zener diodes form a protection circuit.

In particular, as shown in FIGS. 1 and 2, a P$^+$-type rectangular frame-like region 106A, an N$^+$-type rectangular frame-like region 106B, a P$^+$-type rectangular frame-like region 106C, an N$^+$-type rectangular frame-like region 106D and a P$^+$-type rectangular frame-like region 106E are defined in the integrated N$^+$-type inner polycrystalline silicon layers 105B and 105C as if both the N$^+$-type inner polycrystalline silicon layers 105B and 105C are connected to each other by the six Zener diodes which are defined by the rectangular frame-like regions 106A, 106B, 106C, 106D and 106E.

Note that the definition of the P$^+$-type rectangular frame-like regions 106A, 106C and 106E may be carried out by using a P-type impurity-implanting process.

As shown in FIG. 2, a plurality of P-type annular base regions 107 are formed in the rectangular MOSFET-cell formation area defined by the large rectangular frame-like section of the element-isolation layer 103, so that each of the gate silicon dioxide layers 104A is surrounded by the corresponding P-type annular base region 107.

Also, a plurality of N$^+$-type annular source regions 108A are formed in the respective P-type annular base regions 107, so that each of the gate silicon dioxide layers 104A is surrounded by the corresponding N$^+$-type annular source region 108A, resulting in production of a plurality of MOSFET cells in the rectangular MOSFET-cell formation area defined by the large rectangular frame-like section of the element-isolation layer 103. Note that the MOSFET cells function as a single MOSFET which is protected by the aforesaid protection circuit.

When the N$^+$-type annular source regions 108A are formed in the respective P-type annular base regions 107, an N$^+$-type rectangular frame-like region 108B is simultaneously formed in the N-type drain silicon substrate 101 along the sides S1, S2, S3 and S4 of the N-type drain silicon substrate 101.

An insulating inter layer 109 is formed on the N-type drain silicon substrate 101 by using a CVD process, so that the element-isolation layer 103, the N$^+$-type gate polycrystalline silicon layers 105A, the N+-type inner polycrystalline silicon layer 105B and the N+-type outer polycrystalline silicon layer 105C are covered with the insulating interlayer 109.

A rectangular frame-like trench 109A is formed in the insulating interlayer 109 to thereby expose the N+-type rectangular frame-like region 108B.

Also, a rectangular frame-like trench 109B is formed in the insulating interlayer 109 to thereby expose the N+-type inner polycrystalline silicon layer or gate polycrystalline silicon interconnect layer 105B.

Further, a rectangular frame-like trench 109C is formed in the insulating interlayer 109 to thereby expose the N+-type outer polycrystalline silicon layer or drain polycrystalline silicon interconnect layer 105C.

Furthermore, a plurality of annular trenches 109D are formed in the insulating interlayer 109 to thereby expose both the P-type annular base region 107 and the N+-type annular source region 108A, which are formed around each of the N+-type gate polycrystalline silicon layers 105A.

As shown in FIGS. 1 and 2, a rectangular frame-like drain metal interconnect layer 110 is formed on the insulating interlayer 109 so that the rectangular frame-like trenches 109A and 109C are filled with the metal material, whereby the rectangular frame-like drain metal interconnect layer 110 is electrically connected to the N-type drain silicon substrate 101 and the N+-type outer polycrystalline silicon layer or drain polycrystalline silicon interconnect layer 105C.

A rectangular frame-like gate metal interconnect layer 111 is also formed on the insulating interlayer 109 so that the rectangular frame-like trench 109B is filled with the metal material, whereby the rectangular frame-like gate metal interconnect layer 111 is electrically connected to the N+-type inner polycrystalline silicon layer or gate polycrystalline silicon interconnect layer 105B.

Also, a rectangular source metal interconnect layer 112 is formed on the insulating interlayer 109 so that the rectangular frame-like trenches 109D are filled with the metal material, whereby the rectangular source metal interconnect layer 112 is electrically connected to both the P-type annular base region 107 and the N+-type annular source region 108A, which are formed around each of the N+-type gate polycrystalline silicon layers 105A.

Note, for the metal interconnect layers 110, 111 and 112, a suitable metal material such as aluminum may be used, and the formation of the metal interconnect layers 110, 111 and 112 are simultaneously carried out by using a sputtering process.

Figure 3:
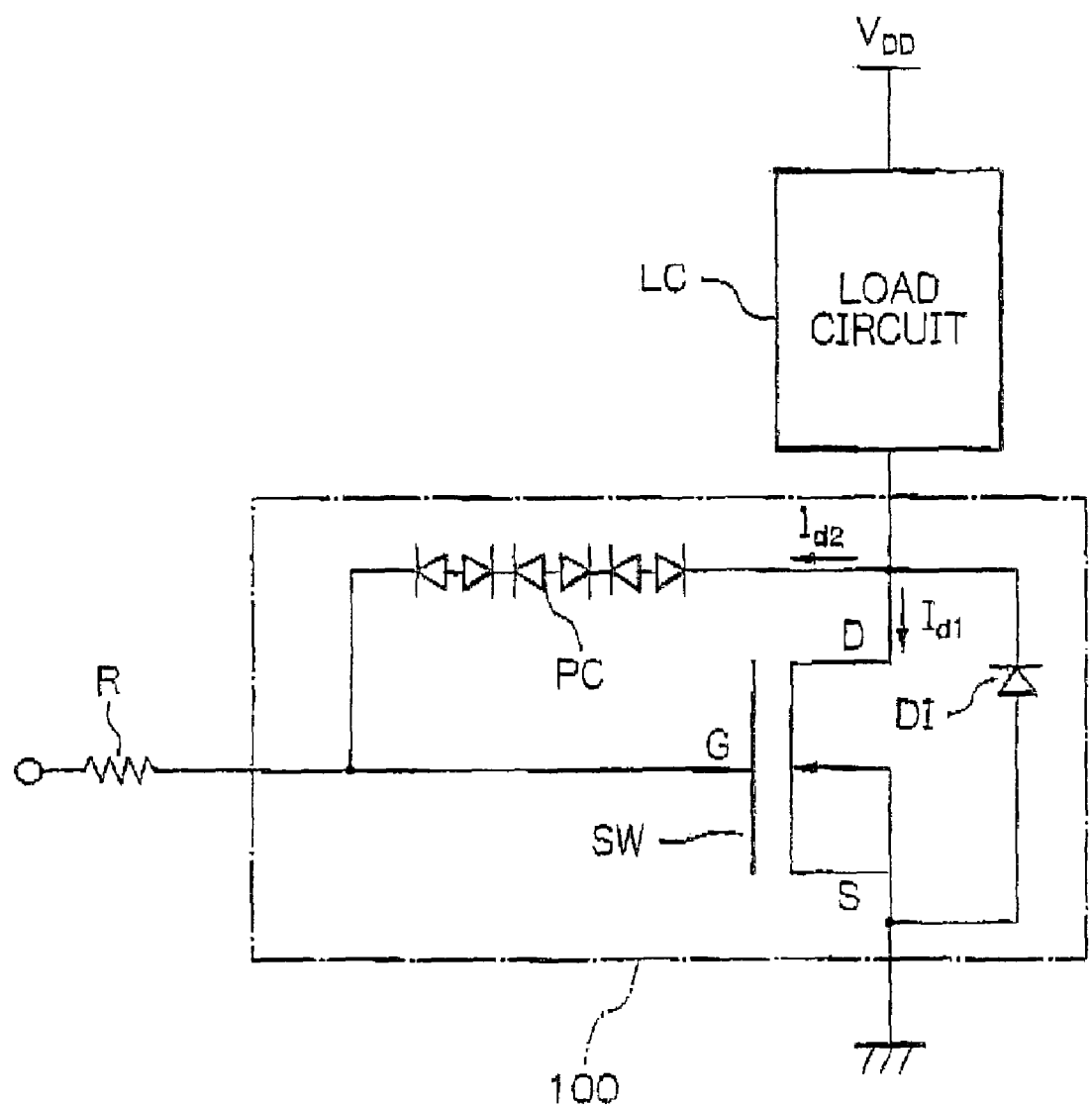
FIG. 3 is a circuit diagram in which the semiconductor device of FIGS. 1 and 2 is combined with a load circuit containing an inductor.

FIG. 3 shows a circuit diagram in which the semiconductor device 100 is combined with a load circuit LC containing an inductor.

In the circuit diagram of FIG. 3, the semiconductor device 100 is shown as an equivalent circuit, the MOSFET of which is used as a power ON/OFF switch SW to energize and de-energize the load circuit LC.

As shown in FIG. 3, the load circuit LC is connected between a power supply terminal for a power supply voltage $V_{DD}$ and the drain D of the power ON/OFF switch SW, with the source S of the power ON/OFF switch SW being grounded.

The protection circuit of the semiconductor device 100 is indicated by reference PC, and is made of the six Zener diodes which are defined by the P+-type frame-like region 106A, the N+-type frame-like region 106B, the P+-type frame-like region 106C, the N+-type frame-like region 106D and the P+-type frame-like region 106E (see: FIGS. 1 and 2). For example, the protection circuit PC has a breakdown voltage of 40 volts.

Although not illustrated in FIGS. 1 and 2, the semiconductor 100 is provided with a diode DI connected between the drain D and the source S of the power ON/OFF switch SW, and a resistor R connected at one terminal thereof to the gate G of the power ON/OFF switch SW and grounded at the other terminal thereof. The diode DI may be formed in the MOSFET-cell formation area defined by the large rectangular frame-like section of the element-isolation layer 103 (see: FIG. 2). For example, the diode DI has a breakdown voltage of 60 volts, and the resistor R has a resistance of 1 kΩ.

In operation, when the power ON/OFF switch SW is turned ON, the load circuit LC containing the inductor (not shown) is energized with the power supply voltage $V_{DD}$ so that a drain current $I_{d1}$ flows through the power ON/OFF switch SW.

When the power ON/OFF switch SW is turned OFF, the load circuit LC is de-energized so that a counter electromotive force is generated by the inductor of the load circuit LC. When a voltage of more than 40 volts is applied to the drain D of the power ON/OFF switch SW due to the generation of the counter electromotive force so that a current $I_{d2}$ of, for example, 3 mA flows through the protection circuit PC, a voltage of 3 volts is applied to the gate G of the power ON/OFF switch SW due to the resistor R having the resistance of 1 kΩ, so that the power ON/OFF switch SW is turned ON, whereby the power ON/OFF switch SW with the diode DI can be protected from being subjected to an avalanche breakdown.

Nevertheless, the semiconductor device 100 of FIGS. 1 and 2 fails in diminishing the size thereof, in that the N-type drain silicon substrate 101 must have the relatively large blank area BA (see: FIG. 2) for the provision of the Zener diodes of the protection circuit PC.

Figure 4:
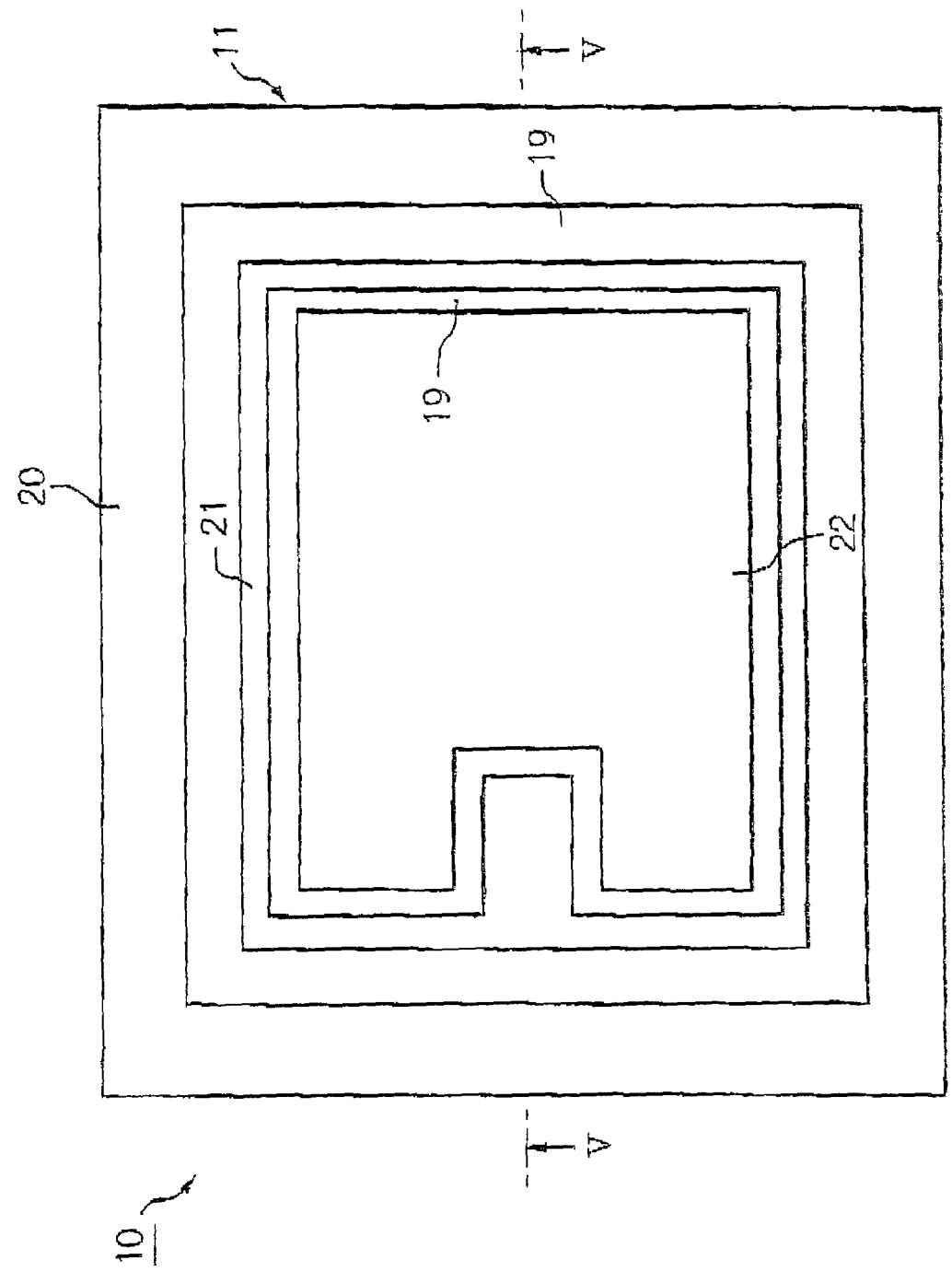
FIG. 4 is a plan view of an embodiment of the semiconductor device including a MOSFET and a protection circuit therefor, according to the present invention.
Figure 5:
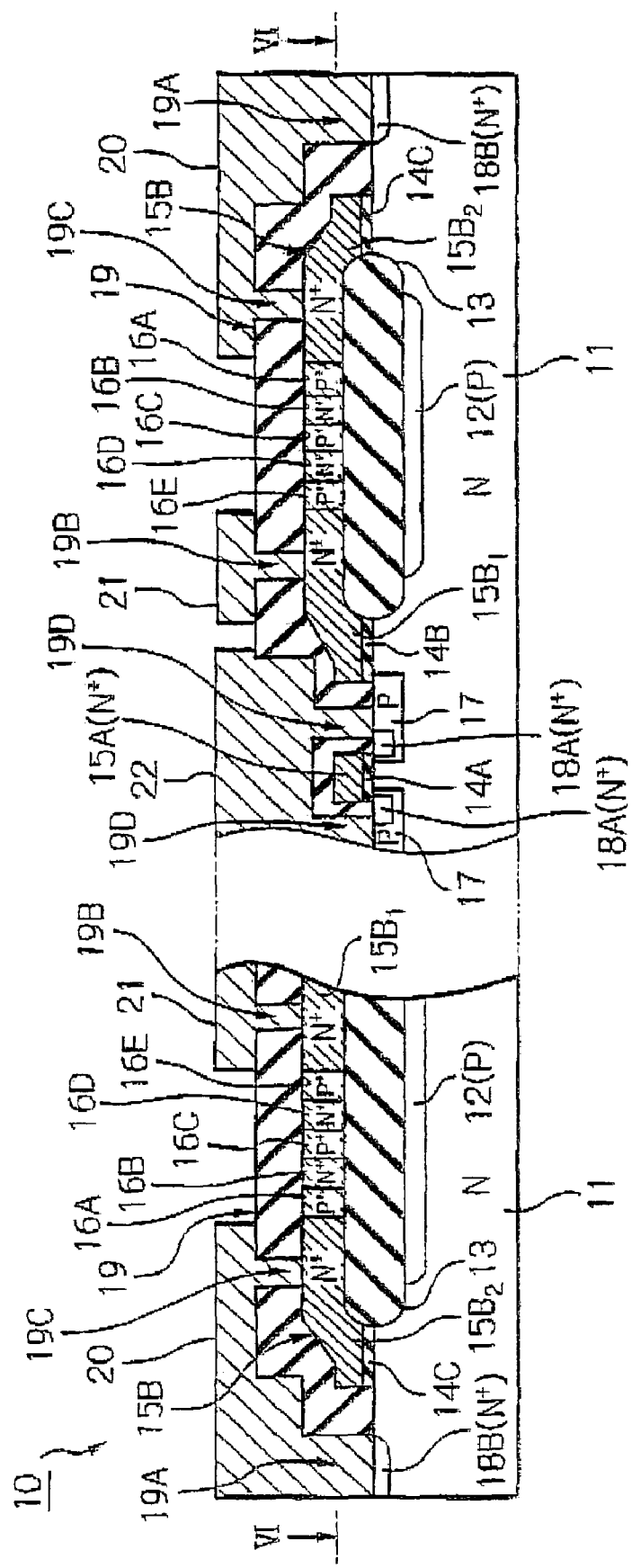
FIG. 5 is a cross-sectional view taken along the V-V line of FIG. 4.
Figure 6:
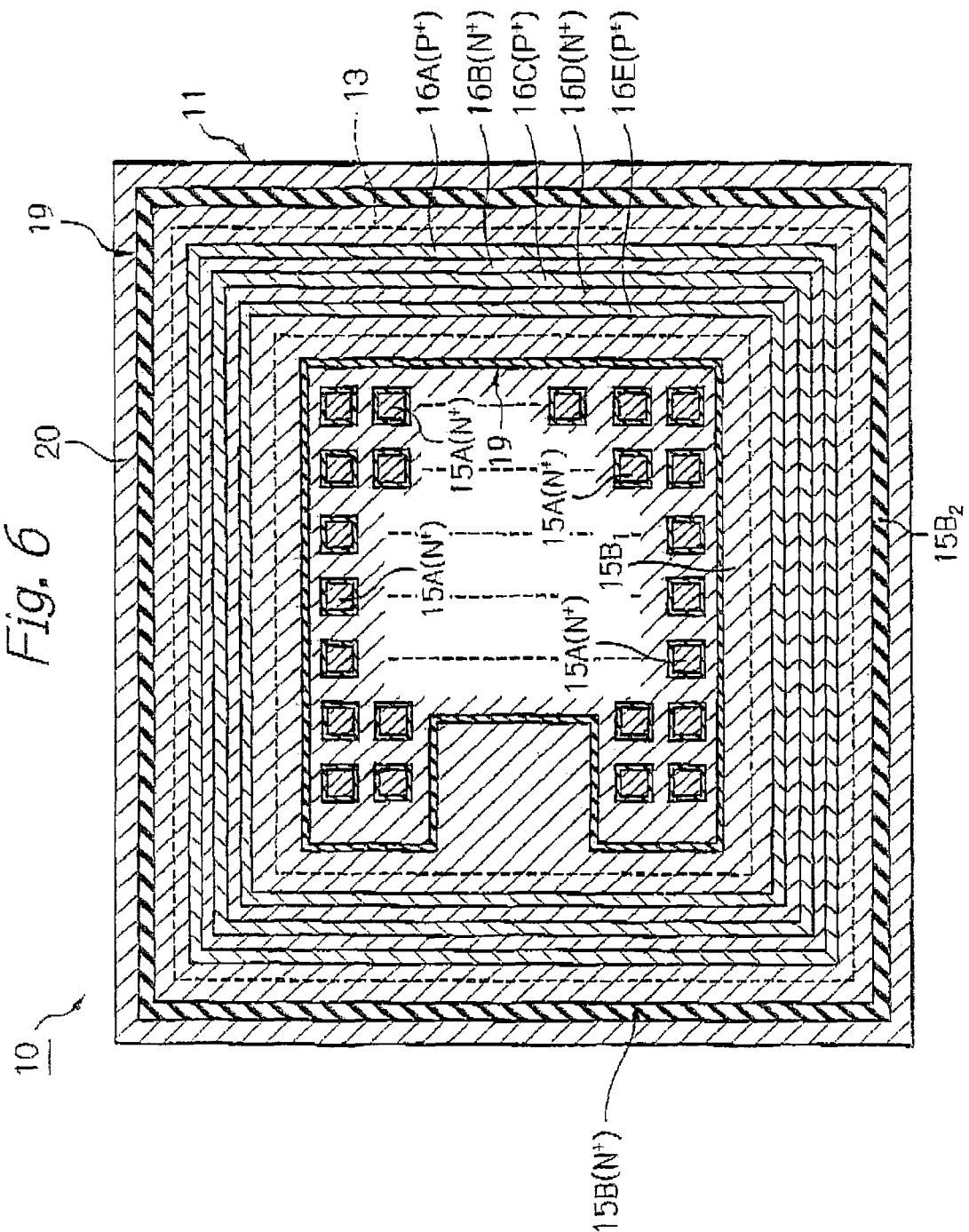
FIG. 6 is a cross-sectional view taken along the VI-VI line of FIG. 5.

FIGS. 4, 5 and 6 show an embodiment of a semiconductor device featuring a protection circuit according to the present invention. Note, FIG. 4 is a plan view of the semiconductor device, FIG. 5 is a cross-sectional view taken along the V-V line of FIG. 4.

Referring to FIGS. 4, 5 and 6, the power MOSFET device is generally indicated by reference 1, and includes an N-type rectangular drain silicon substrate 11.

As shown in FIG. 5, a rectangular frame-like P-type field region 12 is formed in the N-type drain silicon substrate 11 along the four sides thereof, by using a P-type impurity-implanting process. Also, a rectangular frame-like element-isolation layer 13 is formed over the P-type field region 12 by using a localized oxidation of silicon (LOCOS) process, so that a rectangular MOSFET-cell formation area is defined on the N-type drain silicon substrate by the rectangular frame-like element-isolation layer 13.

A plurality of gate silicon dioxide layers 14A are formed on the rectangular MOSFET-cell formation area defined by the rectangular frame-like element-isolation layer 13. Note, in FIG. 5, only one of the gate silicon dioxide layers 14A is representatively illustrated. Also, when the gate silicon dioxide layers 14A are formed on the rectangular MOSFET-cell formation area, both an inner silicon dioxide layer 14B and an outer silicon dioxide layer 14C are simultaneously formed in the N-type drain silicon substrate 11 along the respective inner and outer sides of the rectangular frame-like element-isolation layer 13. The formation of the gate silicon dioxide layers 14A and the inner and outer silicon dioxide layers 14B and 14C may be carried out by using a thermal oxidization process.

As shown in FIGS. 5 and 6, a plurality of N+-type gate polycrystalline silicon layers 15A are formed on the respective gate silicon dioxide layers 14A. Also, when the N+-type gate polycrystalline silicon layers 15A are formed on the respective gate silicon dioxide layers 14A, an N$^+$-type polycrystalline silicon layer 15B is simultaneously formed on the rectangular frame-like element-isolation layer 13 and both the inner and outer silicon dioxide layers 14B and 14C. The formation of the N$^+$-type gate polycrystalline silicon layers 15A and the N$^+$-type polycrystalline silicon layer 15B may be carried out by using a CVD process.

Also, as shown in FIGS. 5 and 6, a P$^+$-type rectangular frame-like region 16A, an N$^+$-type rectangular frame-like region 16B, a P$^+$-type rectangular frame-like region 16C, an N$^+$-type rectangular frame-like region 16D and a P$^+$-type rectangular frame-like region 16E are defined in a middle area of the N$^+$-type rectangular frame-like polycrystalline silicon layer 15B, so that an N$^+$-type inner portion 15B$_1$ and an N$^+$-type outer portion 15B$_2$ are defined in the N$^+$-type frame-like polycrystalline silicon layer 15B, and are connected to each other by six Zener diodes which are formed by the P$^+$-type frame-like region 16A, the N$^+$-type frame-like region 16B, the P$^+$-type frame-like region 16C, the N$^+$-type frame-like region 16D and the P$^+$-type frame-like region 16E. Note that the six Zener diodes form a protection circuit.

Note that the definition of the P$^+$-type rectangular frame-like regions 16A, 16C and 16E may be carried out by using a P-type impurity-implanting process.

Although not illustrated in FIGS. 5 and 6, the N$^+$-type inner portion 15B$_1$ is suitably and electrically connected to each of the N$^+$-type gate polycrystalline silicon layers 15A. Namely, the N$^+$-type inner portion 15B$_1$ serves as a gate polycrystalline silicon interconnect layer.

On the other hand, as stated hereinafter, the N$^+$-type outer portion 15B$_2$ is electrically connected to the N-type drain silicon substrate 11. Namely, the N$^+$-type outer portion 15B$_2$ as a drain polycrystalline silicon interconnect layer.

As shown in FIG. 5, a plurality of P-type base regions 17 are formed in the rectangular MOSFET-cell formation area defined by the rectangular frame-like element-isolation layer 13, so that each of the P-type base regions 17 is surrounded by the N-type drain silicon of the N-type drain silicon substrate 11.

Also, a plurality of N$^+$-type annular source regions 18A are formed in the respective P-type base regions 17, so that a channel region is defined between an outer edge of each of the P-type base regions 17 and a corresponding N$^+$-type annular source region 18A, with both a gate silicon dioxide layers 14A and an N$^+$-type gate polycrystalline silicon layer 15A being placed on a corresponding channel region, resulting in production of a plurality of MOSFET cells in the rectangular MOSFET-cell formation area defined by the rectangular frame-like element-isolation layer 13. Note that the MOSFET cells function as a single MOSFET which is protected by the aforesaid protection circuit.

When the N$^+$-type annular source regions 18A are formed in the respective P-type base regions 17, an N$^+$-type rectangular frame-like region 18B is simultaneously formed in the N-type drain silicon substrate 11 along the sides thereof.

As shown in FIG. 5, an insulating interlayer 19 is formed over on the N-type drain silicon substrate 11 by using a CVD process, so that the N$^+$-type gate polycrystalline silicon layers 15A and the N$^+$-type rectangular frame-like polycrystalline silicon layer 15B are covered with the insulating interlayer 19.

A rectangular frame-like trench or recess 19A is formed in the insulating interlayer 19 to thereby expose the N$^+$-type rectangular frame-like region 18B.

Also, a rectangular frame-like trench 19B is formed in the insulating interlayer 19 to thereby expose the N$^+$-type inner portion or gate polycrystalline silicon interconnect layer 15B$_1$ of the N$^+$-type rectangular frame-like polycrystalline silicon layer 15B.

Further, a rectangular frame-like trench 19C is formed in the insulating interlayer 19 to thereby expose the N$^+$-type outer portion or drain polycrystalline silicon interconnect layer 15B$_2$ of the N$^+$-type rectangular frame-like polycrystalline silicon layer 15B.

Furthermore, a plurality of annular trenches 19D are formed in the insulating interlayer 19 to thereby expose parts of the P-type base regions 17 and parts of the N$^+$-type annular source regions 18A.

As shown in FIGS. 4 and 5, a rectangular frame-like drain metal interconnect layer 20 is formed on the insulating interlayer 19 so that the rectangular frame-like trenches 19A and 19C are filled with the metal material, whereby the rectangular frame-like drain metal interconnect layer 20 is electrically connected to the N-type drain silicon substrate 11 and the drain polycrystalline silicon interconnect layer 15B$_2$ of the N$^+$-type rectangular frame-like polycrystalline silicon layer 15B.

A rectangular frame-like gate metal interconnect layer 21 is also formed on the insulating interlayer 19 so that the rectangular frame-like trench 19B is filled with the metal material, whereby the rectangular frame-like gate metal interconnect layer 21 is electrically connected to the gate polycrystalline silicon interconnect layer 15B$_1$ of the N$^+$-type rectangular frame-like polycrystalline silicon layer 15B.

Also, a rectangular source metal interconnect layer 22 is formed on the insulating interlayer 19 so that the rectangular frame-like trenches 19D are filled with the metal material, whereby the rectangular source metal interconnect layer 22 is electrically connected to the P-type base regions 17 and the N$^+$-type annular source regions 18A.

Note, for the metal interconnect layers 20, 21 and 22, a suitable metal material such as aluminum may be used, and the formation of the metal interconnect layers 20, 21 and 22 are simultaneously carried out by using a sputtering process.

In the circuit diagram of FIG. 3, the semiconductor device 10 of FIGS. 4, 5 and 6 may be substituted for the prior art semiconductor device 100 of FIGS. 1 and 2. In this case, the protection circuit PC is made of the six Zener diodes, which are defined by the P$^+$-type frame-like region 16A, the N$^+$-type frame-like region 16B, the P$^+$-type frame-like region 16C, the N$^+$-type frame-like region 16D and the P$^+$-type frame-like region 16E. Thus, similar to the prior art semiconductor device 100 of FIGS. 1 and 2, the semiconductor device 10 with the diode ID can be protected from being subjected to an avalanche breakdown when a counter electromotive force is generated by the inductor of the load circuit LC, as discussed with reference to FIG. 3.

In addition, it is possible to more compactly construct the semiconductor device 10 in comparison with the prior art semiconductor device 100, because the blank area BA as shown in FIG. 1 can be eliminated from the N-type drain silicon substrate 11 due to the provision of the aforesaid protection circuit between the gate polycrystalline silicon interconnect layer 15B$_1$ and the drain polycrystalline silicon interconnect layer 15B$_2$.

Figure 7:
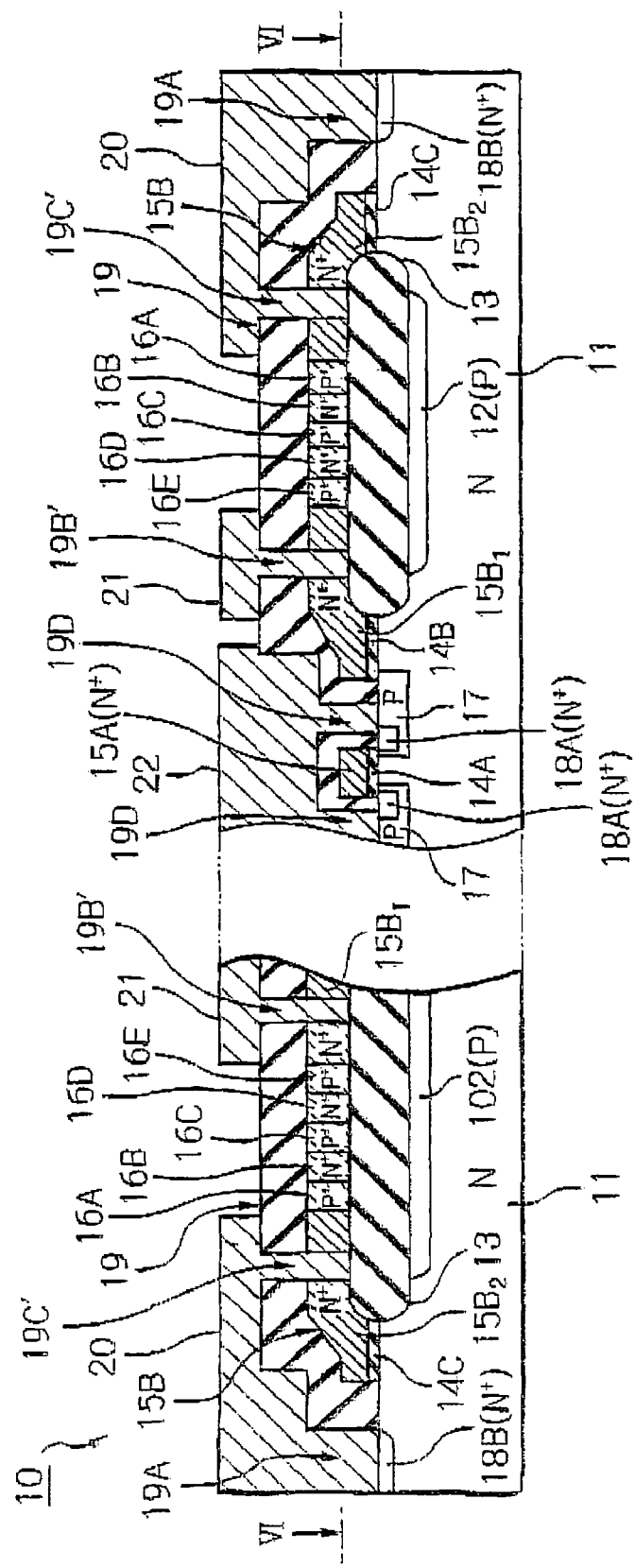
FIG. 7 is a cross-sectional view showing a first modification of the semiconductor device of FIGS. 4, 5 and 6.

FIG. 7, which is a cross-sectional view similar to FIG. 5, shows a first modification of the above-mentioned semiconductor device 10.

In the first modification, a rectangular frame-like trench 19B' is formed in both the insulating interlayer 19 and the gate polycrystalline silicon interconnect layer 15B$_1$ to thereby expose the rectangular frame-like element-isolation layer 13. Thus, when the rectangular frame-like gate metal interconnect layer 21 is formed on the insulating interlayer 19, the rectangular frame-like trench 19B' is filled with the metal material so that a contact area between the rectangular frame-like gate metal interconnect layer 21 and the gate polycrystalline silicon interconnect layer 15B$_1$ can be considerably increased, resulting in diminishment of a contact resistance therebetween.

Similarly, a rectangular frame-like trench 19C' is formed in both the insulating interlayer 19 and the drain polycrystalline silicon interconnect layer 15B$_2$ to thereby expose the rectangular frame-like element-isolation layer 13. Thus, when the rectangular frame-like drain metal interconnect layer 20 is formed on the insulating interlayer 19, the rectangular frame-like trench 19B' is filled with the metal material so that a contact area between the rectangular frame-like drain metal interconnect layer 21 and the drain polycrystalline silicon interconnect layer 15B$_2$ can be considerably increased, resulting in diminishment of a contact resistance therebetween.

In the first modification of FIG. 7, if necessary, by increasing a thickness of the polycrystalline silicon layer 15B, it is possible to further diminish the contact resistance between the rectangular frame-like gate metal interconnect layer 21 and the gate polycrystalline silicon interconnect layer 15B$_1$ and the contact resistance between the rectangular frame-like drain metal interconnect layer 20 and the drain polycrystalline silicon interconnect layer 15B$_2$.

Figure 8:
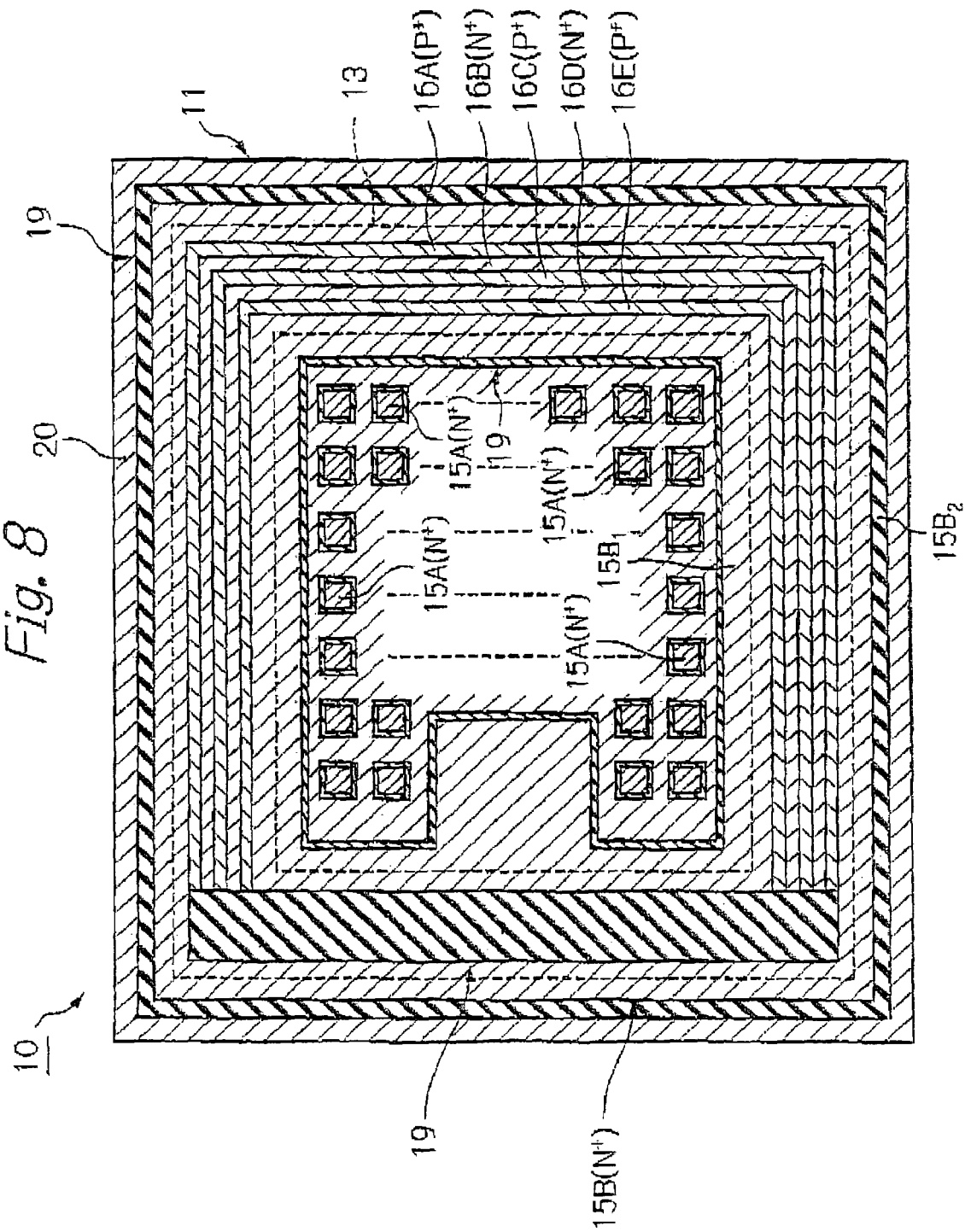
FIG. 8 is a cross-sectional view showing a second modification of the semiconductor device of FIGS. 4, 5 and 6.

FIG. 8, which is a cross-sectional view similar to FIG. 6, shows a second modification of the above-mentioned semiconductor device 10.

In the second modification, side portions of the frame-like regions 16A, 16B, 16C, 16D and 16E are eliminated so that each of these regions is formed as a U-shaped region. Namely, the frame-like regions 16A, 16B, 16C, 16D and 16E partially extend between the gate polycrystalline silicon interconnect layer 15B$_1$ and the drain polycrystalline silicon interconnect layer 15B$_2$, whereby it is possible to reduce a leakage current of the protection circuit PC.

Note, the space, which is defined by the elimination of the side portions of the frame-like regions 16A, 16B, 16C, 16D and 16E, is filled with the material of the insulating interlayer 19.

JP-H08-172167 A discloses a prior art semiconductor device in which a protection diode for protecting a MOSFET from being subjected to an insulation breakage is formed in a rectangular semiconductor substrate itself along the sides thereof. However, the semiconductor device 10 of FIGS. 4, 5 and 6 should be distinguished from the semiconductor device of JP-H08-172167 A in that the Zener diodes, which are defined by the P$^+$-type frame-like region 16A, the N$^+$-type frame-like region 16B, the P$^+$-type frame-like region 16C, the N$^+$-type frame-like region 16D and the P$^+$-type frame-like region 16E, are provided not on the N-type drain silicon substrate 11 itself but on the element-isolation layer 13 formed on the N-type drain silicon substrate 11.

Figure 9:
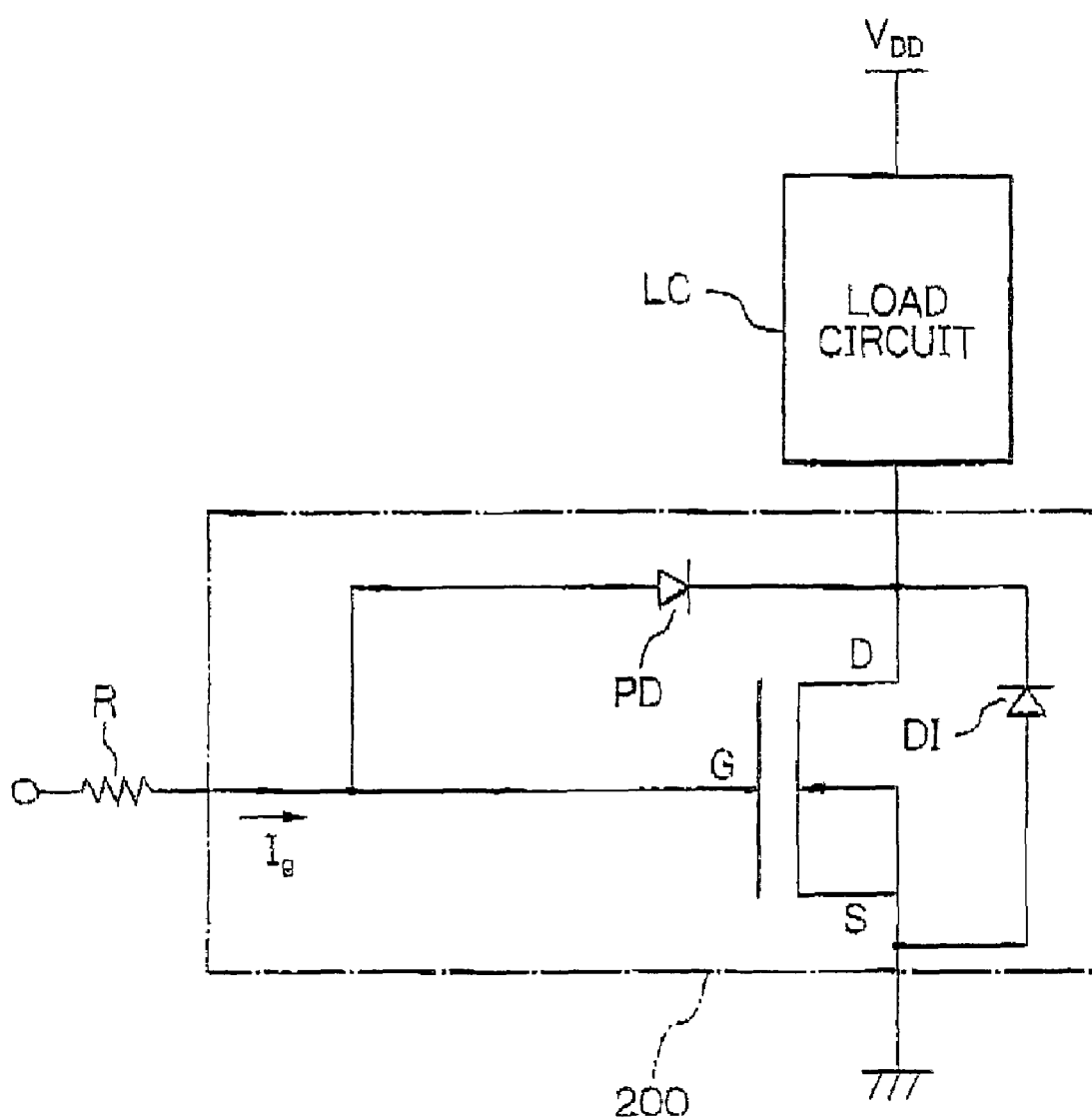
FIG. 9 is a circuit diagram, similar to FIG. 3, in which another prior art semiconductor device is combined with the load circuit containing the inductor.

Referring to FIG. 9 corresponding to FIG. 3 in which the semiconductor device of JP-H08-172167 A is substituted for the prior art semiconductor device 100, the semiconductor device is indicated by reference 200, and the protection diode is indicated by reference PD. The anode and cathode of the protection diode PD are respectively connected to the gate and drain of the MOSFET or power ON/OFF switch SW of the semiconductor device 200. The power ON/OFF switch SW with the diode DI can be also protected from being subjected to an avalanche breakdown when a counter electromotive force is generated by the inductor of the load circuit LC. Nevertheless, when a voltage is applied to the gate G of the power ON/OFF switch SW to turn ON the power ON/OFF switch SW so that a gate current I$_g$ flows through the resistor R, a loss occurs in the gate current I$_g$ because apart of the gate current I$_g$ flows through the protection diode PD. In this regard, the semiconductor device 10 of FIGS. 4, 5 and 6 should be also distinguished from the semiconductor device 200 of FIG. 9.

In the above-mentioned embodiments, although the protection circuit is made of the six Zener diodes, the number of the Zener diodes need not be limited to only six. Namely, the protection circuit may be made of two or more Zener diodes.

Finally, it will be understood by those skilled in the art that the foregoing description is of a preferred embodiment of the semiconductor device, and that various changes and modifications may be made to the present invention without departing from the spirit and scope thereof.

The invention claimed is:

1. A semiconductor device comprising:
   a semiconductor substrate;
   a metal oxide semiconductor field effect transistor (MOSFET) formed in a midregion of said semiconductor substrate;
   an isolation layer formed on said semiconductor substrate and surrounding said midregion;
   a first conductive layer on said isolation layer surrounding said midregion and being electrically connected to a gate of said MOSFET;
   a second conductive layer on said isolation layer surrounding said first conductive layer and being electrically connected to a drain of said MOSFET; and
   a protection circuit on said isolation layer and including at least two diodes which are between and electrically connected to said first conductive layer and said second conductive layer, said protection circuit surrounding said first conductive layer,
   wherein said protection circuit has a rectangular frame shape along a peripheral edge of said semiconductor substrate and wherein the rectangular frame shape has one side eliminated.

2. The semiconductor device as set forth in claim 1, wherein said first and second conductive layers are formed as first and second first-conductivity type layers, respectively, said at least two diodes being defined by forming a second-conductivity type semiconductor region between said first and second first-conductivity type layers.

3. The semiconductor device as set forth in claim 2, wherein said first and second first-conductivity type layers and said second-conductivity type semiconductor region are derived from a first-conductivity type polycrystalline silicon layer formed on said isolation layer, said second-conductivity type semiconductor region being defined by implanting second-conductivity type impurities into said first-conductivity type polycrystalline silicon layer.

4. The semiconductor device as set forth in claim 2, wherein said isolation layer is formed as a frame-like isolation layer along a periphery of said semiconductor substrate, said first and second first-conductivity type layers being formed as first and second frame-like conductive layers which extend along said frame-like isolation layer.

5. The semiconductor device as set forth in claim 4, wherein said second-conductivity type semiconductor region completely extends between said first and second frame-like conductive layers.

6. The semiconductor device as set forth in claim 4, wherein said second-conductivity type semiconductor region partially extends between said first and second frame-like conductive layers.

7. The semiconductor device as set forth in claim 1, wherein said first and second conductive layers are formed as first and second N-type polycrystalline silicon layers, said at least two diodes being defined by forcing a P-type polycrystalline silicon region between first and second N-type polycrystalline silicon layers.

8. The semiconductor device as set forth in claim 7, wherein said first and second N-type polycrystalline silicon layers and said P-type polycrystalline silicon region are derived from an N-type polycrystalline silicon layer formed on said isolation layer, said P-type polycrystalline silicon region being defined by implanting P-type impurities into said N-type polycrystalline silicon layer.

9. The semiconductor device as set forth in claim 1, further comprising:
- an insulating interlayer that covers said first and second conductive layers and said protection circuit;
- a gate metal interconnection layer formed on said insulating interlayer so as to be electrically connected to said first conductive layer through an opening which is formed in said insulating interlayer, and which surrounds said midregion; and
- a drain metal interconnection layer formed on said insulating interlayer so as to be electrically connected to said second conductive layer through an opening which is formed in said insulating interlayer, and which surrounds said midregion.

10. The semiconductor device as set forth in claim 1, further comprising:
- an insulating interlayer that covers said first and second conductive layers and said protection circuit;
- a gate metal interconnection layer formed on said insulating interlayer so as to be electrically connected to said first conductive layer through an opening which is formed in both said insulating interlayer and said first conductive layer, and which is filled with a material of said gate metal interconnection layer; and
- a drain metal interconnection layer formed on said insulating interlayer so as to be electrically connected to said second conductive layer through an opening which is formed in both said insulating inter layer and said second conductive layer, and which is filled with a material of said drain metal interconnection layer.

11. The semiconductor device of claim 1, further comprising a source metal interconnection layer in said midregion and electrically connected to a source of said MOSFET, said source metal interconnection layer being surrounded by said protection circuit.

* * * * *